(12) United States Patent
Ito et al.

(10) Patent No.: US 7,452,140 B2
(45) Date of Patent: Nov. 18, 2008

(54) PROTECTIVE SEALING OF OPTOELECTRONIC MODULES

(75) Inventors: Masataka Ito, Torrance, CA (US); Toshi K. Uchida, Rancho Palos Verdes, CA (US)

(73) Assignee: Ibiden Co., Ltd., Ogaki-shi (JP)

( * ) Notice: Subject to any disclaimer, the term of this patent is extended or adjusted under 35 U.S.C. 154(b) by 554 days.

(21) Appl. No.: 10/621,891

(22) Filed: Jul. 16, 2003

(65) Prior Publication Data

US 2005/0053336 A1    Mar. 10, 2005

(51) Int. Cl.
*G02B 6/36* (2006.01)

(52) U.S. Cl. .............................. 385/94; 385/88; 385/92

(58) Field of Classification Search .................. 385/89, 385/92, 94
See application file for complete search history.

(56) References Cited

U.S. PATENT DOCUMENTS

| | | | |
|---|---|---|---|
| 4,732,446 A | | 3/1988 | Gipson et al. |
| 4,966,430 A | | 10/1990 | Weidel |
| 5,412,748 A | * | 5/1995 | Furuyama et al. ............. 385/92 |
| 5,684,902 A | * | 11/1997 | Tada ........................... 385/88 |
| 5,764,833 A | * | 6/1998 | Kakii et al. ................... 385/54 |
| 5,966,488 A | * | 10/1999 | Miura et al. .................. 385/93 |
| 6,075,911 A | * | 6/2000 | Goto ............................ 385/31 |
| 6,269,209 B1 | * | 7/2001 | Terada et al. ................... 385/51 |
| 6,330,377 B1 | | 12/2001 | Kosemura |
| 6,435,734 B2 | * | 8/2002 | Okada et al. ................... 385/88 |
| 6,457,875 B1 | | 10/2002 | Kropp et al. |
| 6,554,491 B2 | * | 4/2003 | Sotokawa et al. ............. 385/88 |
| 6,655,856 B2 | * | 12/2003 | Nakanishi et al. ............. 385/94 |
| 6,793,405 B1 | * | 9/2004 | Murata et al. ................. 385/88 |
| 7,075,117 B2 | * | 7/2006 | Yamada ....................... 257/98 |
| 7,350,987 B2 | * | 4/2008 | Finot et al. .................... 385/94 |
| 2002/0037143 A1 | * | 3/2002 | Kuhara et al. ................. 385/94 |
| 2002/0150357 A1 | * | 10/2002 | Hammond et al. ............ 385/92 |
| 2003/0210874 A1 | * | 11/2003 | Souda et al. ................... 385/89 |
| 2004/0057678 A1 | * | 3/2004 | Morris et al. .................. 385/92 |
| 2004/0109649 A1 | * | 6/2004 | Mazotti et al. ................ 385/94 |
| 2004/0228601 A1 | * | 11/2004 | Porter et al. ................ 385/139 |

* cited by examiner

*Primary Examiner*—M. R. Connelly-Cushwa
*Assistant Examiner*—Rhonda S Peace
(74) *Attorney, Agent, or Firm*—Oblon, Spivak, McClelland, Maier & Neustadt, P.C.

(57) ABSTRACT

A method and structures for protectively enclosing and sealing optoelectronic modules having emitter or detector diode arrays aligned with optical fiber facets in optoelectronic transmitters and receivers. A non-hermetic enclosure provides mechanical protection of the components during alignment and assembly of the module. A substantially hermetic enclosure provides additional protection of optoelectronic components against airborne contaminants or moisture. The protective enclosures physically encompass the diode array chip with its delicate wire bonds and also provide a liquid containment dam for easier application of resin for protective encapsulation of the diode array chip. Dual resin encapsulation may include a first resin layer chosen for transparency and a harder setting covering layer. These protective variants can be implemented in different combinations offering varying degrees of protection of the optical components.

49 Claims, 7 Drawing Sheets

PROTECTIVE SEALING OF OPTOELECTRONIC MODULES

BACKGROUND OF THE INVENTION

1. Field of the Invention

This invention pertains generally to the field of optoelectronic data transmitter/receiver modules and in particular concerns protective sealing of optical assemblies in such modules.

2. State of the Prior Art

Optoelectronic transmitter/receiver modules are used for communicating over optical fiber links as opposed to electrical cables. Optical transmission has advantages over electrical conductors, such as relative immunity from interference, low loss transmission over long distances, and high data rate capacity, among still others. Optoelectronic devices serve to interface electronic circuits, in which the signals are generated or processed, to optical fiber cables for transmission to other electronic circuits.

Optoelectronic transmitters convert electrical signals to optical signals for transmission via optical fiber, while optoelectronic receivers perform the opposite operation of converting optical signals received via optical fiber to electrical signals. A transmitter and a receiver may be packaged together in a transceiver module. Multichannel optoelectronic modules transmit and receive signals simultaneously over multiple parallel fibers or channels, and depending on the application, four, eight or more parallel data channels may be used. For example, a four channel transceiver module requires eight optical fibers, four fibers for transmission and four fibers for reception. Flat ribbon cable is commercially available in different widths containing varying numbers of optical fibers for interconnecting multichannel modules.

Optoelectronic modules, whether transmitter, receiver or transceiver modules, are usually packaged in a module housing containing a printed circuit board on which are mounted electronic circuits and devices for electronic signal processing and an optical assembly which interfaces the electronic circuits of the module to an optical fiber link. This optical assembly normally includes a semiconductor diode array mounted in optical alignment with the fiber facets of an optical fiber array supported in a fiber block. In a transmitter module the diode array includes light emitter diodes which are typically laser diodes, although LEDs may be substituted in some applications. The laser or LED diodes convert drive current supplied by the module's electronic circuits to a light output which is carried by the optical fibers. In a receiver module the diode array includes photo detector diodes. Light signals delivered by the optical fibers illuminate the photo detector diodes which convert these light signals to electrical signals. Transceiver modules have both a laser diode array chip and a photo detector diode array chip, and each chip is aligned with a corresponding subset of the fiber facets of the fiber block. For simplicity of explanation, the following description is limited to an optoelectronic module with a single diode array, which may be either a PE array or a PD array unless otherwise stated, and for convenience may be referred to as a PD/PE array.

Each diode array, whether emitter or detector, is typically manufactured on a single semiconductor chip where the diodes are arranged on the chip as an evenly spaced linear array on a common surface or edge of the chip. Due to differences in manufacturing processes, laser diode arrays and photo detector arrays are made on separate chips. These semiconductor chips are small and delicate, and are supported by bonding, as with epoxy adhesive, to a submount of appropriate material, such as aluminum nitride or aluminum oxide. The submount also carries electrical conductors, usually applied as printed circuit traces, for interconnecting the diodes of the array to the electronic circuits of the optoelectronic module. This interconnection is made by wire bond connections of very thin wire between the diode array chip and the conductive traces on the submount. The wire bonds can be made with conventional wire bonding machines. Each wire bond is a small arc of bare wire welded at each end to the electrodes or terminals which are electrically connected by the wire bond. The arc of the wire bond rises to some height above the electrodes, the height depending on the particular wire bonding machine used.

The optical fiber array of the module includes a number of relatively short fiber lengths supported between two substrates of the fiber block. Each fiber length of the fiber array terminates in an end facet on an end face of the fiber block. Each facet is illuminated by a corresponding light emitter diode (in a transmitter) or itself illuminates a corresponding photo detector diode (in a receiver). The opposite, outer ends of the optical fiber array are optically coupled by industry standard optical connectors to an external optical fiber cable, such as a flat ribbon cable, which interconnects the optoelectronic module to another optoelectronic module.

The diode array chip with its wire bonds is mechanically delicate and susceptible to mechanical damage or breakage while being handled in the process of alignment and assembly of the module. The diode chips are also vulnerable to degradation by airborne pollutants, while the fiber facets are adversely affected by condensation of moisture.

Optoelectronic communications modules are used in a wide range of operating environments, depending on the application. In some cases the equipment containing the modules is installed in protected, air conditioned rooms, where the modules are sheltered in a controlled environment and are readily accessible for maintenance and replacement if needed. In these cases a lesser degree of hardening and reliability of the modules is needed. In other applications, such as long haul communications, the modules may be installed in equipment exposed the outdoor environment in harsh climates, and in remote or difficult to access locations such as on mountaintops or undersea cable installations. In the latter cases, a high degree of hardening and reliability of the modules is desirable due to the high cost of repairs.

For this reason, optoelectronic modules are often packaged in relatively costly, hermetically sealed module housings. Lower cost alternate solutions have been sought for protective sealing of optoelectronic modules, particularly for less critical applications. One lower cost technique has been to encapsulate the optoelectronic components in transparent resin. A coating of transparent resin is applied over the components and, after the resin sets and hardens, it provides a relatively durable, chemically and mechanically resistant encapsulating layer.

A difficulty encountered in making such resin seals is that the resins tend to be fluid and runny in their initial uncured state, and when first applied to the optoelectronic components, the epoxy resin has a tendency to run off the component before hardening. Thicker paste resins have been used in a one step encapsulation process. Most paste resins, however, have inferior transparency and light transmission characteristics and may become too hard when set, which poses a risk of damage to the diode array chip and its delicate wire bonds. In the past this problem has been addressed by a two step encapsulation process. First, a thicker epoxy formulation, which itself may be undesirable as an encapsulating epoxy, is applied to the submount around the diode array chip to form a raised containment barrier or dam for the more fluid encapsulating epoxy resin. After the barrier epoxy has set, the more fluid encapsulating epoxy is applied over the component. This is an awkward, time consuming and labor intensive procedure, and a simpler, more expedient technique is needed.

SUMMARY OF THE INVENTION

This invention discloses method and structures for protectively enclosing and sealing the optical assembly generally comprising the emitter or detector diode arrays and fiber facets in optoelectronic transmitters and receivers. The protective enclosures described can be implemented to different degrees of protection of the optical components. In one form of the invention a non-hermetic enclosure provides mechanical protection of the components during alignment and assembly of the module. In another form of the invention the enclosure may be substantially hermetic for additional protection of the optoelectronic components against airborne contaminants or moisture. The hermetic or non-hermetic enclosures, in addition to physically enclosing and protecting the diode array chip with its delicate wire bonds, also provides a liquid containment dam during application of sealing resin for protective encapsulation of the diode array chip, avoiding the need for the two step application of epoxy described in the preceding section. For still greater protection the resin encapsulation may include two resin layers, a first inner layer chosen for characteristics such as transparency or setting hardness or both, and an hard setting, second covering layer. These protective variants can be implemented in different combinations, such as a non-hermetic enclosure for mechanical protection of resin encapsulated components, or fully implemented protection including double layered resin encapsulation contained in a hermetic enclosure.

In yet another form of the invention, a fluid containment dam is provided which encompasses the optical components to be encapsulated in resin so as to prevent run-off of the initially liquid sealing resin, but where the containment dam need not otherwise cover or fully enclose the optical components. In this embodiment, the containment dam may take the form of a wall supported on the submount and encompassing at least the diode array chip, and the wall has sufficient height to contain resin to a depth sufficient to submerge the diode array chip in the sealing resin.

The protective and fluid containment structures described also facilitate the process of optically aligning and assembling the diode array chip to the fiber block during assembly of the optoelectronic modules and by increasing the contact area between the bonded elements of the optical assembly serve to strengthen the resulting assembly. Protective structures are disclosed which are suitable for edge emitting laser diode chips, surface emitting laser diode chips, LEDs, and photodetector diode chips. In the following descriptions, the term diode array refers to arrays of light emitting diodes, including laser diode array or LED arrays, or arrays photo detector diodes. References to laser diode arrays are interchangeable with photo detector diode arrays. In some embodiments reference is made to edge emitting laser diode arrays. Laser diodes are commercially available in edge emitting configurations and in surface emitting configurations. Photo detector diode arrays, on the other hand, are generally made on chip surfaces rather than along chip edges, such that structures described below in connection with surface emitting diodes are also suitable for use with photo detector array chips. Structures described for use with edge emitting diodes are primarily for edge emitting laser diode arrays only. It should be understood, however, that by appropriate mounting of the diode array chips to their submount, the optical assembly structures disclosed herein can be adapted for use with either edge emitting or surface emitting diodes or with photo detector diodes.

Various embodiments of the invention are now summarized below.

In one embodiment of this invention, the optoelectronic module has an optical fiber array terminating in fiber facets on an end face of an optical fiber block, a submount joined to the end face, and an edge emitting laser diode array bonded to the submount in optical alignment with the fiber facets. The diode array chip is electrically connected by wire bonds to conductors on the submount, which in turn are operatively connected to electronic circuits of the module. A protective cap is joined to either or both the submount and to the end face for enclosing the array including the wire bonds and a portion of the fiber block including the facets. The cap may be joined in hermetic sealing relationship to the submount and to the fiber block so as to define a chamber containing the diode array and the fiber facets. The cap has a cap bottom bonded to the submount and encompassing the diode array, and a cap end bonded to the optical fiber block and encompassing the fiber facets. The cap may be a one piece cap, or a two piece cap having a cap side wall portion and a separate cap cover bonded to the side wall portion. The diode array may be encapsulated in sealing resin substantially transparent to light wavelengths passing between the diode array and the fiber facets, such as silicone resin. The sealing resin may also encapsulate the fiber facets on the end face of the fiber block. The cap may have an injection hole for introducing the sealing resin in an initially fluid uncured state into the chamber such that cap serves as a containment dam for containing the initially fluid resin. The sealing resin may include layers of different resins, such as a relatively pliant inner resin layer encapsulating the diode array and a relatively hard outer resin layer covering the inner resin.

In another embodiment of the invention, the optoelectronic module has optical fibers terminating in fiber facets on an end face of an optical fiber block, a surface emitting laser diode array or photo detector diode array bonded to a submount; and a spacer interposed between and bonded to the submount and to the end face for enclosing the diode array and a portion of the fiber block including the fiber facets. The diode array has a top surface which faces the fiber facets on the end face, and the diode elements of the array are arranged on the top surface with wire bonds between the top surface and the submount. The spacer has a spacer width between the submount and the fiber block sufficient to accommodate the combined height of the diode array and the wire bonds. The spacer may be open or may be a closed frame hermetically bonded to the submount and to the fiber block for defining a sealing chamber containing the diode array and the fiber facets. In either case the diode array and the wire bonds may be encapsulated in sealing resin substantially transparent to light transmissions between the diode array and the fiber facets. The spacer may have an opening for admitting the resin into the chamber, and the opening may be sealed with the resin thereby to seal the chamber.

This invention also contemplates a method of sealing an optical assembly for use in an optoelectronic transmitter or receiver module, comprising the steps of providing an optical fiber block supporting one or more optical fibers each terminating in a fiber facet on an end face of the block to define a fiber facet array, providing a submount having a top surface and a side surface; bonding a diode array chip to the top surface of the submount; providing a cap having an end surface, affixing the cap to the submount, optically aligning the diode array with the fiber facet array, and bonding the submount to the optical fiber block. Preferably, the cap has an end surface and the cap end surface is also bonded to the fiber block.

The combined submount side surface and the cap end surface provide a larger area of contact with the fiber block to facilitate optical alignment and better bonding of the substrate with the diode array to the fiber block with the fiber facets.

The cap may have three side walls and a cap top, with the end face of the fiber block providing a fourth wall and the submount providing a bottom, thereby to define a chamber containing the laser diode array and the fiber facet array. The cap cooperates with the fiber block to define a fluid containment enclosure encompassing the diode array chip and the wire bonds; and the method may further comprising the step of applying liquid sealing resin in the fluid containment enclosure to encapsulate the diode array chip. The cap may have a hole through the cap top for admitting initially liquid resin into the chamber, and the hole may be sealed with resin.

The cap may have a cap sidewall portion and a separate cap top, and the step of affixing may include the step of affixing the cap sidewall portion to the submount to thereby define with the end face a fluid containment enclosure for containing liquid epoxy resin applied to the diode array, and then affixing the cap top to the cap sidewall thereby to define the chamber.

The method of this invention may also be understood as having the steps of providing an optical fiber block supporting a number of optical fibers each terminating in a fiber facet on an end face of the block to define a fiber facet array, providing a submount, bonding a diode array chip to the submount, affixing a containment dam to the submount for defining a fluid containment enclosure encompassing the diode array chip; assembling the submount, the containment dam and the optical fiber block with the diode array chip in optical alignment with the fiber facet array, and applying liquid sealing resin to encapsulate the diode array chip. The step of assembling may include bonding the containment dam between the submount and the fiber block, or bonding the containment dam to the submount and then bonding both the submount and the containment dam to the fiber block. The containment dam may have one or more end surfaces and the step of assembling comprises bonding the one or more end surfaces to the fiber block.

The submount may have a side surface for bonding to the fiber block and the containment dam may have one or more end surfaces, such that the step of affixing comprises the step of aligning the one or more end surfaces in coplanar relationship with the side surface, and the step of bonding comprises bonding both the side surface and the one or more end surfaces to the fiber block, such as to the end face of the fiber block.

The containment dam may cooperate with the optical fiber block to make a closed chamber containing the diode array and the fiber facet array. For example, the containment dam may feature a cap having three side walls and a cap top, the end face providing a fourth wall and the submount providing a bottom thereby to define a closed chamber containing the diode array and the fiber facets. The cap top may be unitary with the cap side walls, and a hole may be provided through the cap, such as through the cap top, for admitting the liquid sealing resin into the closed chamber. In the case where the cap has a cap side wall and a separate cap top, the step of affixing a containment dam may include the step of affixing the cap side wall to the submount and to the fiber block and thereby define the fluid containment enclosure. The method may further include the step of affixing a cap top to the cap sidewall thereby to define a closed chamber containing the diode array chip and the fiber facet array.

The containment dam may be at least partly defined by a cap having a plurality of cap side walls and a cap top such that the cap cooperates with the optical fiber block to make a closed chamber containing the diode array and the fiber facet array. Alternatively, the containment dam may be at least partly defined by a spacer interposed between opposing surfaces of the substrate and the optical fiber block. The spacer may have first and second end surfaces, and in such case the step of affixing comprises the step of affixing the first of the end surfaces to the submount and the step of assembling comprises the step of bonding the second of the end surfaces to the optical fiber block, such as to the end face of the optical fiber block.

The spacer can be a closed frame in which case the step of applying the liquid epoxy to the diode array is performed after affixing the spacer frame to the submount about the diode array and the wire bonds, and then performing the assembling step by bonding the frame to the fiber block.

Also, the spacer may be a frame having a side opening through the frame and the step of applying liquid epoxy is performed after the aforementioned steps of affixing and assembling by introducing liquid epoxy through the side opening of the spacer frame. The side opening may then be sealed with epoxy resin.

In more general terms the optoelectronic module of this invention has a housing module with electronic transmitter or receiver circuits in the housing module, an optical fiber block having optical fibers terminating in fiber facets on an end face of the block, an emitter/detector diode array mounted on a submount in optical alignment with the fiber facets and operatively connected to the electronic transmitter or receiver circuits, and chamber defining means bonded to the submount and to the fiber block for enclosing the diode array and at least a portion of the end face including the fiber facets.

In one form of the invention the submount is also bonded to the fiber block such that both the submount and the chamber defining means are both bonded to the fiber block. The submount may have a side surface and the chamber defining means may have one or more end surfaces coplanar with the side surface such that both the side surface and one or more of the end surfaces contact the end face, such that alignment of the diode array to the fiber facets is facilitated and both the side surface and one or more of the end surfaces are bonded to the fiber block for increased mechanical strength. In another form of the invention the chamber defining means is intermediate to the submount and the fiber block and the submount is supported to the fiber block by the chamber defining means.

In either form of the invention the chamber defining means may be bonded in substantially sealing engagement to the submount, and one or more of the end surfaces is bonded in substantially sealing engagement with the end face such that the diode array and the fiber facets are enclosed in a sealed chamber. The chamber defining means may also define a fluid containment dam about the diode array including the wire bonds, and the diode array is encapsulated in sealing resin contained by the dam.

The chamber defining means is selected from the group comprised of a cap enclosure and a spacer enclosure. In one case the chamber defining means is a cap where the one or more end surfaces is an end surface, which may be shaped as an inverted U relative to the submount. In another case the chamber defining means is a spacer such as a frame, which may be rectangular, with either a closed perimeter or an open perimeter, and opposing end surfaces.

The invention is also a method of making an optical assembly for use in a transmitter or receiver module comprising the steps of providing an optical fiber block supporting an optical fiber array, each fiber terminating in a fiber facet on an end face of the fiber block to define a fiber facet array, providing a submount and a containment dam, bonding a diode array chip to the submount, bonding the containment dam to the submount, and bonding one or both of the containment dam and submount to the fiber block with the diode array chip in optical alignment with the fiber facet array.

The containment dam may include a number of side walls on a top surface of the submount, the side walls terminating in end surfaces joined to the end face of the fiber block to define a closed containment perimeter about the diode array and wire bonds with the submount providing a bottom. For example, a side wall portion with three side walls may be joined to the fiber block such that the end face provides a fourth wall and the substrate provides a bottom. A separate cap top may be applied to the side wall portion and against the end face to make a protective cap enclosing the diode array, the wire bonds and the fiber facets. The side wall portion of the containment dam may be U-shaped, terminating in two of the aforementioned end surfaces, which may be coplanar with each other. The two end surfaces may also be coplanar with a side surface of the submount such that the end surfaces and the bonding surface are all bonded to the end face of the fiber block. The containment dam may be installed with or without the cap cover. An open top containment dam may be provided by installing only the side wall portion, and encapsulating the diode array in resin contained by the dam. The resin encapsulation may be hardened with a layer of hard setting resin applied over an inner layer of sealing resin.

These and other improvements, features and advantages will be better understood by reference to the following detailed description of the preferred embodiments and accompanying drawings.

DETAILED DESCRIPTION OF THE PREFERRED EMBODIMENTS

Figure 1:
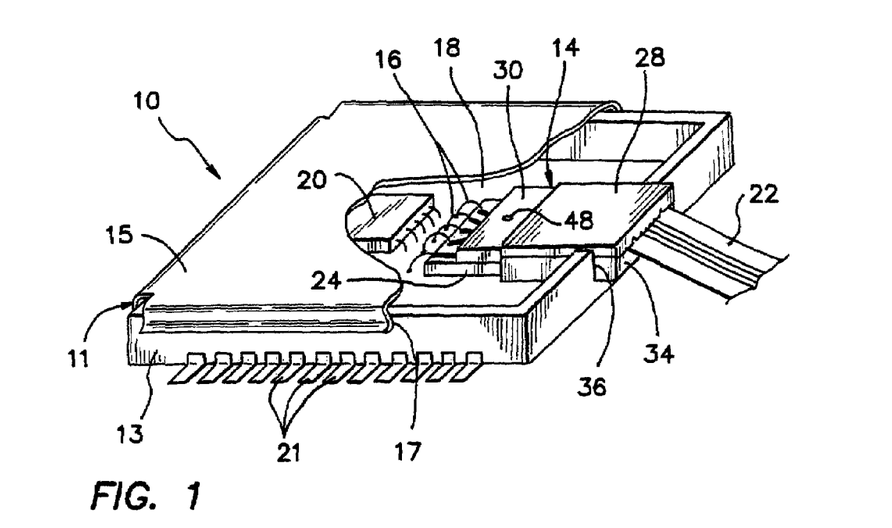
FIG. 1 shows a typical optoelectronic module with a protective cap enclosure according to this invention.

With reference to the accompanying drawings in which like elements are designated by like numerals, FIG. 1 shows a typical optoelectronic module, generally designated by numeral 10, which has an optical assembly 14 according to one embodiment of this invention.

Module 10 has a module housing 11 including a housing bottom 13 and a housing cover 15. A printed circuit board 18 mounted on the housing bottom carries electronic circuits 20 which process signals transmitted or received by the module 10. External package leads 21 interconnect the electronic circuits 20 to other circuits external to the module 10. The optical assembly 14 interfaces the electronic circuits 20 to an optical fiber pigtail 24 terminated in a suitable optical connector (not shown). The optical assembly 14 as seen in FIG. 1 has a submount 24, a protective cap 30 and an optical fiber block 28. The optical assembly 14 also includes a semiconductor diode array chip 26 mounted on submount 24 and covered in FIG. 1 by cap 30, but shown in FIG. 3 and other Figures.

Figure 2:
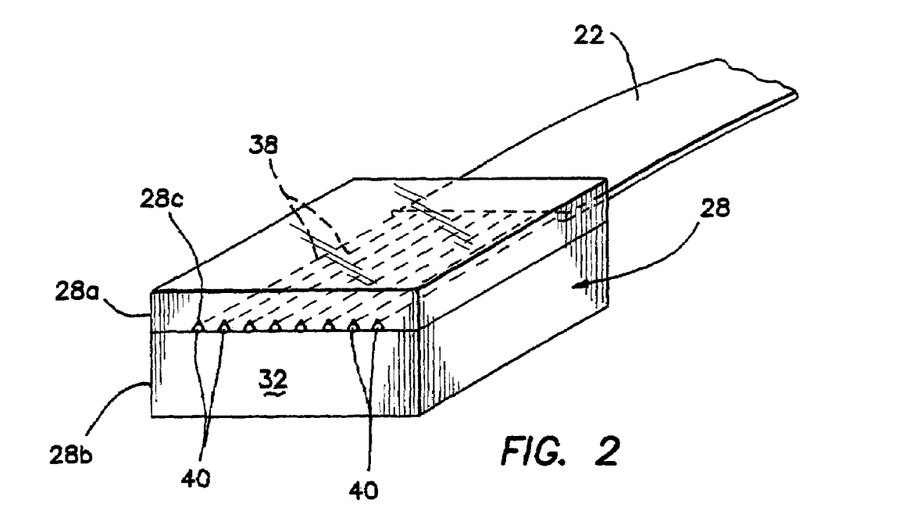
FIG. 2 shows the fiber facet array on the end face of the optical fiber block.

As seen in FIG. 2, the optical fiber block 28 includes an upper substrate 28a and a lower substrate 28b, an end face 32 and an opposite outer end 34. Fiber block 28 contains an array of mutually parallel optical fibers 38 contained between substrates 28a, 28b in parallel V-grooves 28c extending from end face 32 to opposite end 34. Each optical fiber 38 terminates in a fiber facet 40 on end face 32, forming a linear array of fiber facets 40, as shown in FIG. 2. In FIG. 1 the fiber block 28 is mounted in an opening 36 in the module housing bottom 13 such that the end face 32 is interior to the module housing 11 and the opposite end 34 together with optical fiber pigtail 24 is exterior to the housing 11. The fibers 38 in the fiber block 28 are continuous with fibers in pigtail 24. The upper substrate 28a may be of glass or glass ceramic which is molded or cut so as to form the parallel V-grooves 28c in a bottom surface of this substrate. Alternatively, silicon may be used and chemically etched to make the V-grooves. The lower substrate 28b may have a planar upper surface bonded to the grooved bottom surface of upper substrate 28a by suitable means such as an adhesive. Lower substrate 28b may be of the same materials, or of a heat dissipating material such as Aluminum Nitride (AlN), or of aluminum oxide ($Al_2O_3$) in applications where heat dissipation is not an issue.

Figure 3:
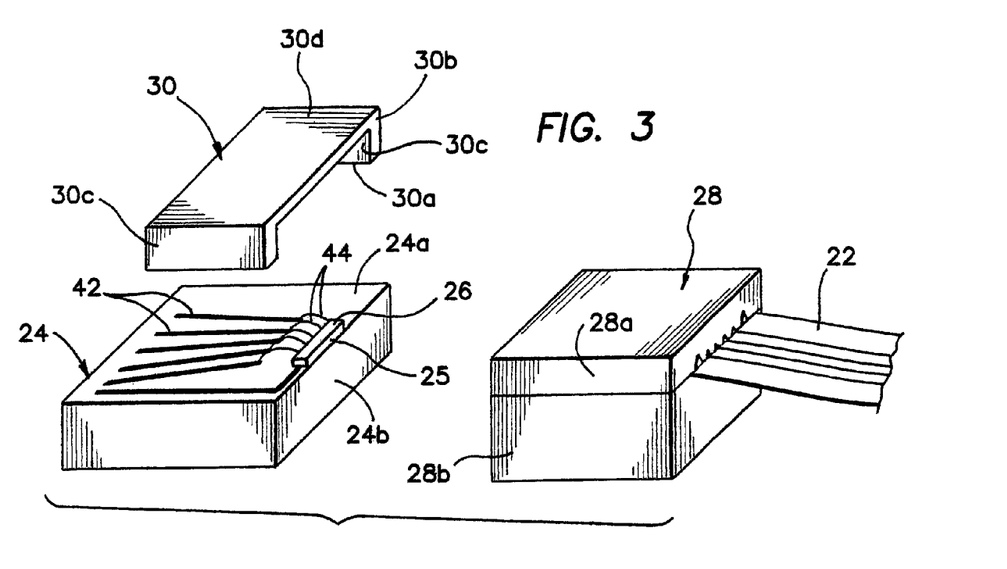
FIG. 3 is an exploded view of an optical assembly with a one-piece protective cap, a submount with diode array chip and an optical fiber block.

FIG. 3 shows in exploded view the optical assembly 14 including a one-piece protective cap 30, chip submount 24 with bonded LE/LD diode array chip 26 and optical fiber block 28. The submount 24 has a top surface 24a and a side surface 24b. The chip 26 may be an edge emitting laser diode array chip with a number of laser diodes spaced along a relatively narrow emitting edge 25 and with the diodes facing facets 40 on the fiber block 28. The relatively wider underside of the diode array chip 26 is bonded, as by means of epoxy adhesive, to the top surface 24a with emitting edge 25 of the diode array slightly recessed from the side surface 24b to avoid contact between the diodes of chip 26 and the end face 32. The submount 24 may be of a heat dissipating material, such as Aluminum Nitride, to act as a heat sink for the diode chip 26, or of aluminum oxide ($Al_2O_3$) if the LE/LD diode array chip 26 does not require a heat sink and heat dissipation is not an issue. The diode array chip 26 has various chip electrodes which are connected to conductive traces 42 on the submount surface 24a by means of wire bonds 44 of very fine wire applied by conventional wire bonding machinery. Traces 42 may be applied by a thin film printing technique so that the traces have a small thickness above the submount surface 24a. The submount conductors 42 are in turn connected to printed circuit board 18 by suitable conductors such as wire bonds 16, as in FIG. 1.

Figure 4A:
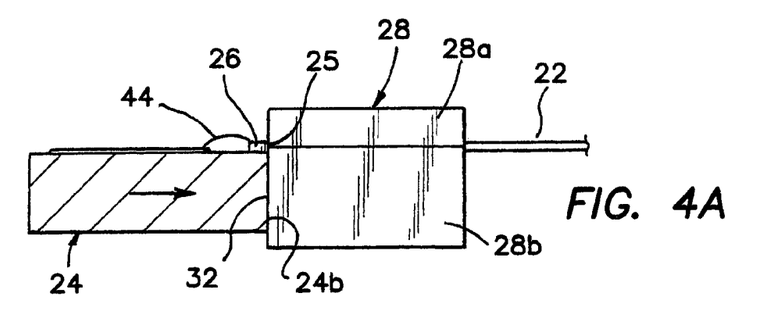
FIG. 4A illustrates in side view the bonding of the submount to the optical fiber block with the diode array in optical alignment with the fiber facets of the fiber block.

Submount 24 is assembled to fiber block 28 as indicated in FIG. 4A. This assembly includes optical alignment of the laser diode chip 26 to the fiber facets 40. Alignment is normally performed with the aid of a suitable mechanical manipulator under optical magnification. Active alignment is performed by applying power to the laser diodes arrayed along emitting edge 25 of chip 26 while monitoring light output of the optical fibers 38 at the end connector of pigtail 22. Ultraviolet (UV) setting epoxy resin is applied to side surface 24b and the side surface is brought into contact with end face 32. The submount 24 is positioned relative to the fiber block 28 so as to achieve a desired degree of optical alignment of the laser diodes with optical fibers 38. The submount and fiber block can then be temporarily bonded and joined to each other by ultraviolet illumination of the UV setting resin. More permanent bonding of submount 24 to fiber block 28 may be made by any appropriate bonding technology known in the field, such as epoxy bonding or laser welding, for example.

Figure 4B:
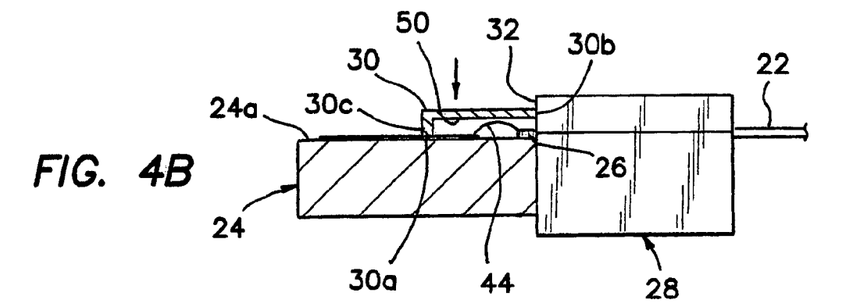
FIG. 4B depicts installation of the one-piece protective cap by bonding to the submount and to the end face of the fiber block to make a chamber enclosing the diode array and fiber facets.

As shown in FIG. 4B, protective cap 30 is bonded to both submount 24 and to end face 32 so as to enclose the diode array chip 26 as well as a portion of end face 32 which includes fiber facets 40. The one piece cap 30 has three sidewalls 30c and an integral cap top 30d. The bottoms of the three side walls together define a U-shaped cap bottom 30a. The end surfaces of two side walls 30c together with cap end surface 30b of the cap top 30d define a U-shaped cap end surface 30b. Cap bottom 30a is bonded to top surface 24a encompassing chip 26, and cap end surface 30b is bonded to end face 32 encompassing the array of fiber facets 40. The cap 30 provides the three side walls 30c and cap top 30d, the submount top surface 24a provides a floor and the end face 32 supplies a fourth wall to define an enclosing chamber 50 containing the diode array chip 26 and fiber facets 40.

It may be convenient to install the cap 30 after the submount 24 and fiber block 28 have been aligned and assembled. However, the cap 30 may also be affixed to either one of the submount 24 or the fiber block 28 prior to the alignment procedure, and affixed to the other of the submount 24 or the fiber block 28 after alignment.

Cap 30 may be bonded, as by appropriate epoxy adhesive or other suitable bonding methods, in hermetic or near hermetic sealing relationship to both submount 24 and end face 32, thereby to provide a substantially hermetic chamber 50. Substantially hermetic sealing of the chip 26 and facets 40 by the cap 30 in chamber 50 suffices for many applications as a substitute for conventional hermetic sealing of the entire module housing 12. In such case, in the module 10 of FIG. 1 it may suffice to fasten the housing cover 15 to housing bottom 13 by means of a non-hermetic crimp fastening 17, as opposed to hermetic welding of the housing cover to bottom 15.

For applications where a lesser degree of reliability is acceptable, the cap 30 may be affixed or bonded to either or both the submount 24 and fiber block 28 in non-hermetic fashion, in which case the cover provided by cap 30 offers protection against mechanical damage to chip 30 and wire bonds 44, particularly when the parts are handled during alignment and bonding of optical assembly 14.

Figure 4C:
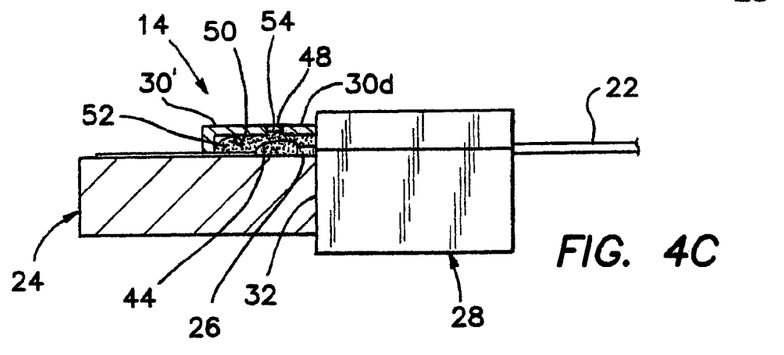
FIG. 4C illustrates a one-piece cap perforated with a resin injection hole and shows resin encapsulation of the diode array and fiber facets inside the cap and sealing of the injection hole with the resin.
Figure 5:
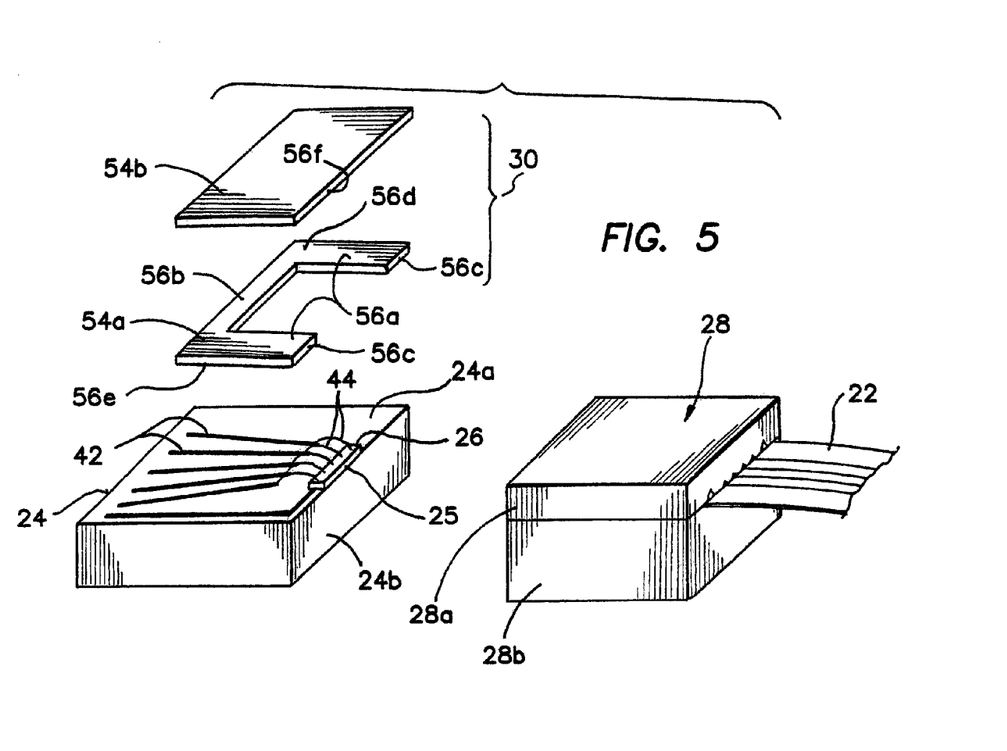
FIG. 5 is a view as in FIG. 3 but showing a two piece cap having a side wall portion and a separate cap top.

FIG. 4C shows the completed optical assembly 14 of FIG. 1 with a one piece protective cap 30' which is similar to cap 30 of FIG. 3 except that cap 30' is perforated by a resin injection hole 48 through the cap top 30d for introducing sealing resin in an initially fluid uncured state into the chamber where 50. In this case, the cap 30' also serves as a containment dam for the fluid sealing resin. Preferably, sufficient sealing resin is introduced through hole 48 to at least cover the chip 26 and wire bonds 44. When cured, the sealing resin hardens to encapsulate the chip 26 and its wire bonds 44 within a generally transparent solid resin mass 52. The resin mass 52 may cover and encapsulate the chip 26 and also the fiber facets 40 so as to fill the space therebetween. The resin mass 52 may extend to form a plug 54 of resin rising from the interior of chamber 50 to seal injection hole 48, as also shown in FIG. 4C. The sealing resin is chosen for good transparency at the wavelengths emitted by the laser diodes of chip 26. In cases where the chip 26 and wire bonds 44 are especially delicate, the sealing resin is also selected to be relatively soft setting, to reduce the risk of damage to the chip 26 and wire bonds 44 which might be caused by a hard setting resin. One suitable sealing resin is silicone resin, which is substantially transparent at the wavelengths of interest and sets to a relatively pliable resilient cured state.

In another embodiment of the invention illustrated in FIGS. 5 and 6A through 6D, a two piece protective cap 30" has a cap side wall portion 54a and a separate cap cover 54b. The side wall portion is generally U-shaped with two side walls 56a joined at one end by a transverse end wall 56b. The opposite ends of the two side walls have free ends which terminate in end surfaces 56c. The two end surfaces 56c are preferably flat and coplanar with each other. The side wall portion 54a also has a top surface 56d and a bottom surface 56e.

Figure 6A:
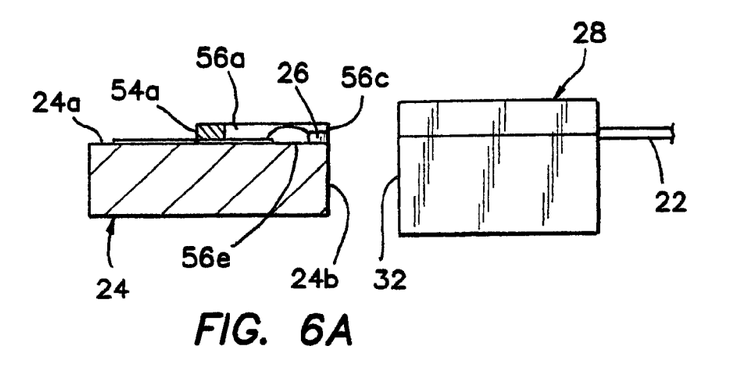
FIG. 6A illustrates in side view the cap sidewall bonded to the submount while encompassing the diode array, prior to assembly to the optical fiber block.
Figure 6B:
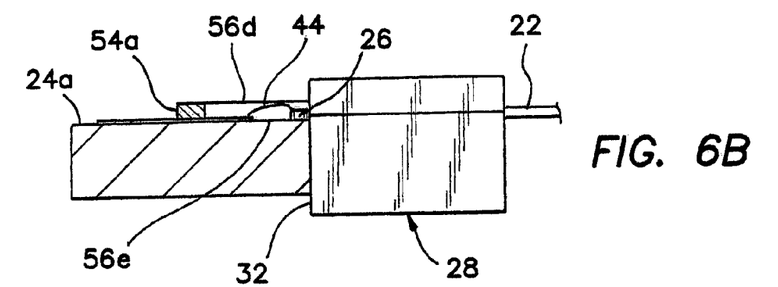
FIG. 6B shows the submount and cap side wall bonded to the end face of the fiber block with the diode array in optical alignment with the fiber facets of the fiber block and defining a fluid containment dam around the diode array chip.

The presently preferred sequence of assembly of this embodiment is illustrated in FIGS. 6A to 6D. As shown in FIG. 6A, the bottom 56e of the side wall portion 54a is bonded to top surface 24a of submount 24 such that the chip 26 lies between the side walls 56a and the end surfaces 56c are coplanar with side surface 24b. The submount side surface 24b and side wall end surfaces 56c are then bonded as with epoxy adhesive to end face 32 of fiber block 28, as depicted in FIG. 6B, after positioning submount 24 to optically align the diodes of chip 26 with corresponding fiber facets 40 on end face 32, as described above in connection with FIG. 4A. The end surfaces 56c are added to the side surface 24b to augment the contact area between the submount 24 and the end face 32. The larger contact area facilitates the alignment process by stabilizing the two parts relative to each other during alignment, as well as providing a larger bonding area for greater mechanical strength of the completed assembly 14. The end face 32 closes the open end of the U-shaped side wall portion 54a to define a fluid containment dam into which may be applied liquid sealing resin for encapsulating the diode array chip 26.

Figure 6C:
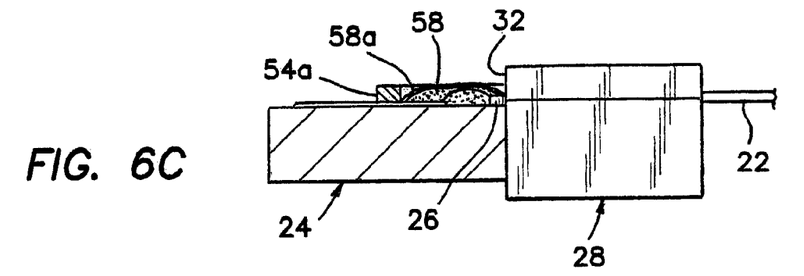
FIG. 6C shows how the diode array chip is encapsulated in a layer of resin applied inside the containment dam.

Assembly may be completed with or without resin encapsulation of the diode array chip 26. FIG. 6C illustrates the resin encapsulation stage. In FIG. 6C a sealing resin is applied to cover the chip 26 in a first resin layer 58. This resin application is preferably a soft setting resin substantially transparent at the diode chip's operating wavelengths. After the first resin layer 58 has set to encapsulate chip 26, an optional second resin layer 58a is applied over the first resin layer 58. The second resin layer 58a may be a hard setting epoxy which after curing provides a harder protective shell over the softer first resin layer 58. Assembly may stop at this stage, so that the optical assembly 14 is protected by resin encapsulation as in FIG. 6C, either a single resin layer 58 or double resin layer 58, 58a, but without a cap cover or other non-resin enclosure of the chip 26.

Figure 6D:
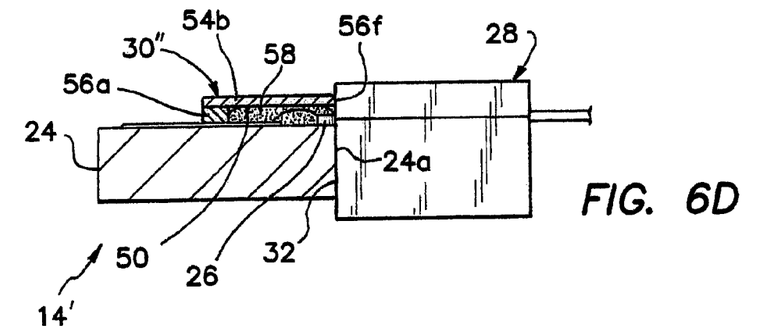
FIG. 6D shows an additional level of protection provided in the optical assembly of FIG. 6C.

An additional level of protection illustrated in optical assembly 14' of FIG. 6D may be provided by bonding cap top 54b to top surface 56d of the side wall portion 54a to cover and enclose the interior of the side wall portion 54a, and to define a chamber 50 containing the diode array chip 26 and the fiber facets 40 on end face 32. One edge or end surface 56f of the cap top 54b may be bonded to the end face 32 to complete a hermetic seal of chamber 50. The height or thickness of the side wall portion 54a measured between top and bottom surfaces 56d, 56e is at least slightly greater than the height of wire bonds 44 above submount surface 24a and also rises above the array of fiber facets 40 on end face 32 so as to include the facets 40 in chamber 50.

Figure 6E:
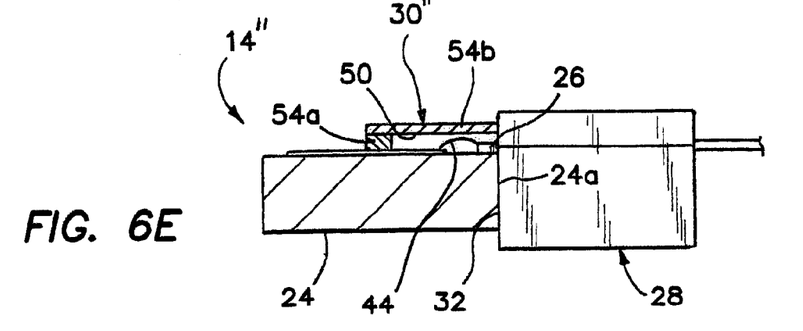
FIG. 6E shows the cap top affixed to the cap side wall and to the end face to make a chamber enclosing the encapsulated diode array chip.

FIG. 6E shows an alternate implementation of the invention in optical assembly 14" wherein the two piece protective cap 30" is installed without resin sealing of the chip 26. The cap 30" may be bonded in hermetic sealing relationship to submount 24 and fiber block 28 to define a hermetic chamber 50 containing chip 26 and facets 40.

Figure 7:
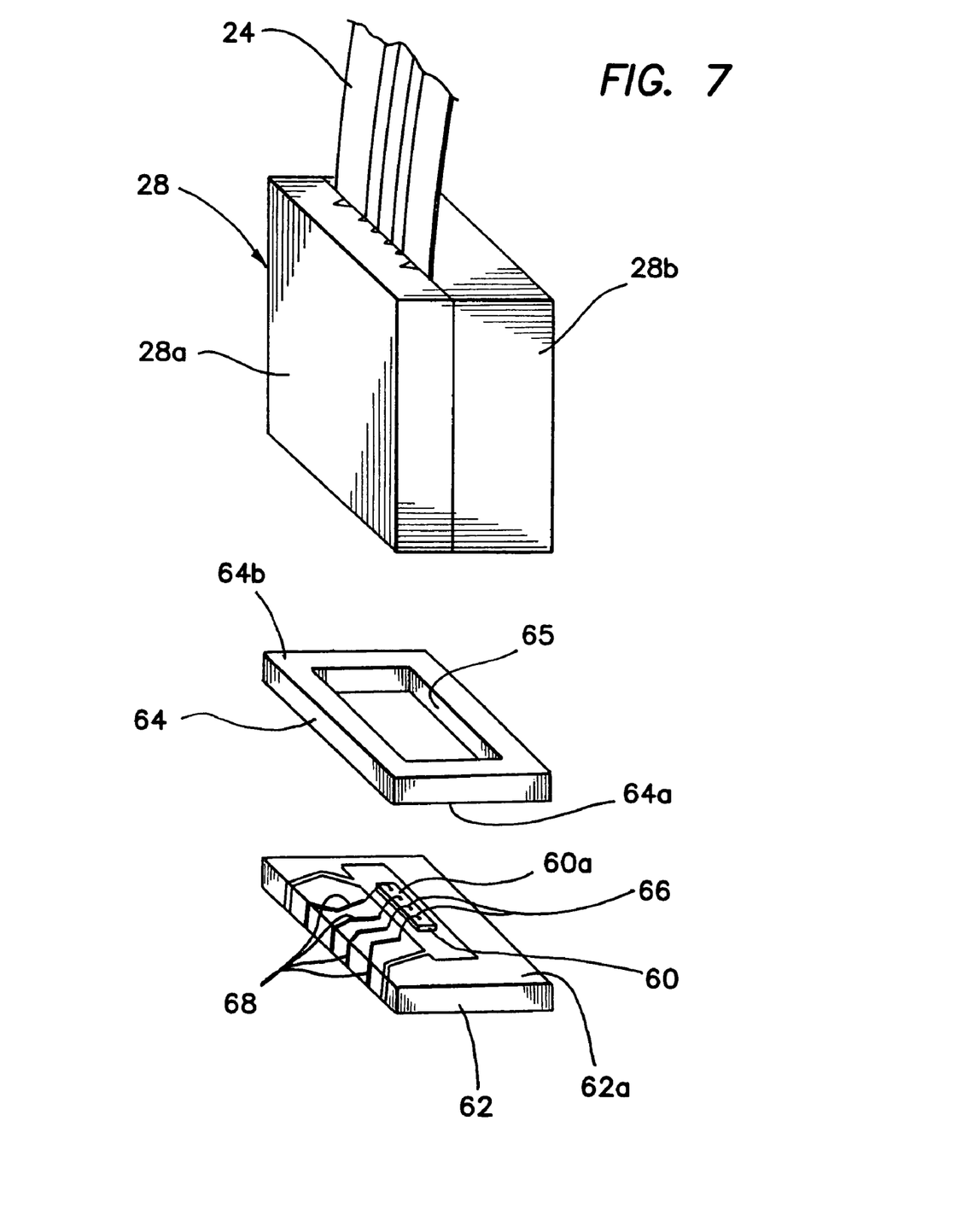
FIG. 7 illustrates a sealing arrangement suitable for surface emitting laser diode chips, LED chips and photodetector chips using a spacer interposed between the chip submount and the optical fiber block.

FIG. 7 shows another embodiment of the invention where a LE/LD diode array 60 is bonded to top surface 62a of submount 62. In the case of a LE diode array, the chip 60 may be a surface emitting laser diode array or a light emitting diode (LED) array. A spacer 64 is interposed between and affixed to submount 62 and to end face 32 of fiber block 28 for enclosing diode array 60 and a portion of the end face 32 including fiber facets 40. Diode array chip 60 has an array of diode elements along top surface 60a which faces end face 32 of the fiber block 28. The diode elements are electrically connected to conductive traces 68 on submount 62 by wire bonds 66 arcing between chip electrodes provided on top surface 60a of the diode array chip and conductors 68. The submount 62 may be of a heat dissipating material, such as Aluminum Nitride, to act as a heat sink for the diode chip 60, or Aluminum Oxide, among other possible choices of material.

Figure 8A:
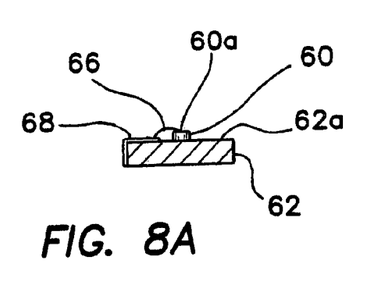
FIG. 8A is a side view of the diode array chip bonded to the chip submount and wire bonded to electrodes on the submount.
Figure 8B:
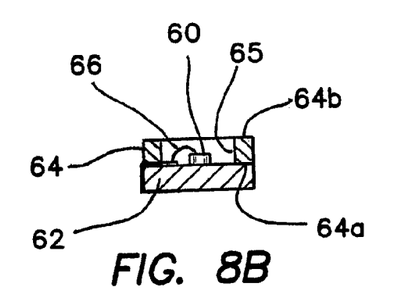
FIG. 8B shows how the spacer is bonded to the submount and the spacer width is greater than the combined height of the diode array chip and the wire bonds to define a fluid containment submount.

The spacer 64 of FIG. 7 is in the shape of a rectangular frame defining a four sided closed perimeter of sufficient interior aperture to accommodate and encompass the diode array chip 60 between its four sides. FIG. 8A illustrates how diode chip 60 and wire bonds 66 rise above submount top surface 62a. The spacer 64 has opposite end surfaces 64a, 64b. End surface 64a is bonded to submount top surface 62a, as in FIG. 8B. The width of spacer 64 between end surfaces 64a, 64b is greater than the combined height of the diode chip 60 and wire bonds 66 above submount top surface 62a as illustrated in FIG. 8B, such that both the chip 60 and wire bonds 66 are contained below the upper end surface 62b of spacer 64.

Further assembly of the submount 62 to the fiber block 28 includes optical alignment of the submount bonded chip 60 to the fiber facets 40, and assembly of the spacer 64, together with submount 62, to the fiber block 28. The assembly may proceed with or without resin sealing of the diode chip 60.

Figure 8C:
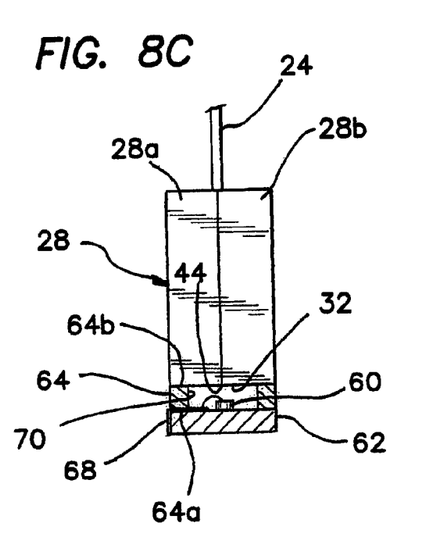
FIG. 8C illustrates bonding of the spacer to the fiber block so as to assemble the chip submount to the fiber block and shows how the spacer provides a protective enclosure containing the diode array chip and fiber facets without resin encapsulation.

In FIG. 8C submount 62 and spacer 64 are assembled to fiber block 28 by bonding end surface 64b to end face 32 such that the array of fiber facets 40 is encompassed within the interior aperture defined by the perimeter of spacer 64. This step is normally performed with the aid of a mechanical manipulator due to the small size of the parts and the relatively high degree of precision required to achieve optimal alignment of the diode array chip 60 and fiber facets 40. In one form of the assembly, the spacer 64 is bonded in hermetic relationship to both submount 62 and to end face 32 to define a hermetic chamber 70 for sealing the diode array chip 60 and the fiber facets 44. Hermetic bonding is achieved by appropriate selection and application of adhesive or other known bonding techniques.

Figure 8D:
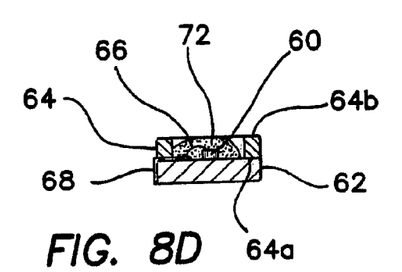
FIG. 8D depicts the application of sealing resin inside the fluid containment dam defined by the spacer in FIG. 8B before assembly to the fiber block.
Figure 8E:
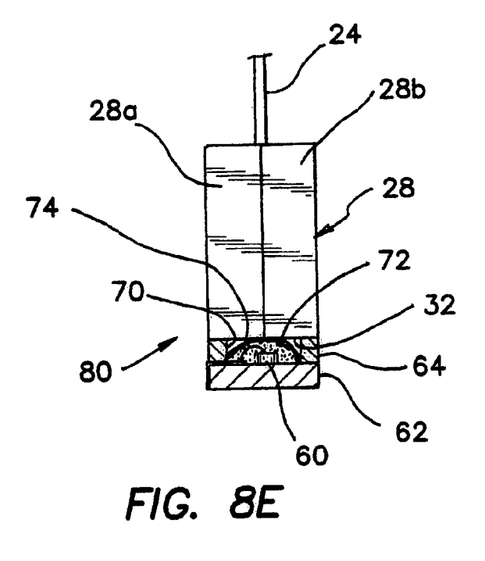
FIG. 8E shows the submount and spacer assembled to the fiber block such that the resin encapsulated diode array chip is protected in the chamber defined by the spacer between the submount and the fiber block.

In FIG. 8D the diode chip 60 is encapsulated in a resin seal 72 applied as initially liquid sealing resin selected as in previously described embodiments for transparency to light transmissions between the diode array 60 and fiber facets 40. As seen in FIG. 8D the closed interior perimeter 65 of spacer 64 defines a fluid containment dam around chip 60 with submount 62 as a bottom, where the chip 60, including top face 60a and preferably also wire bonds 66, can be submerged in sealing resin 72. After the sealing resin 72 cures to a relatively solid state, assembly can proceed as in FIG. 8E with bonding of the end surface 64b to end face 32 thereby to assemble the submount 62, the spacer 64 and the fiber block 28 into a unitary optical assembly 80. Hermetic bonding of the spacer 64, to both submount 62 and fiber block 28, defines a hermetically sealed chamber 70 which supplements the epoxy encapsulation 72 for a higher degree of protection of the optical components. A double resin seal can be provided, for still greater protection, by applying a harder setting epoxy layer 74 over the inner sealing resin encapsulation 72, before assembling the spacer 64 to the fiber block 28. In this case the harder setting epoxy layer 74 is selected for sufficient optical transparency at the operating wavelengths of the chip 60.

Figure 8F:
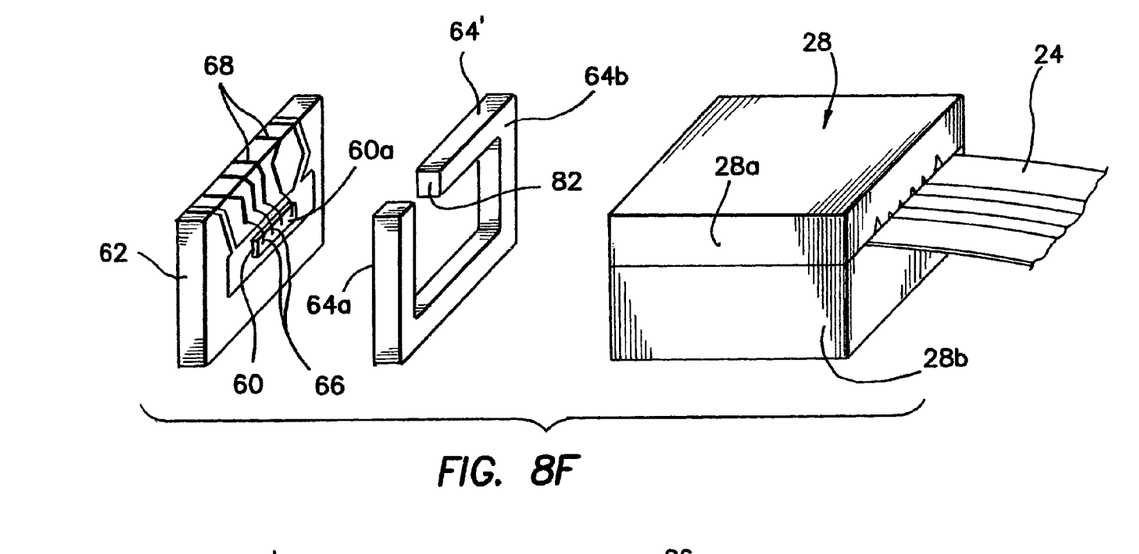
FIG. 8F shows an open spacer having a resin injection port such that sealing resin may be introduced for encapsulating the diode array chip after the submount and spacer have been assembled to the fiber block to make a protective enclosure containing the chip.
Figure 8G:
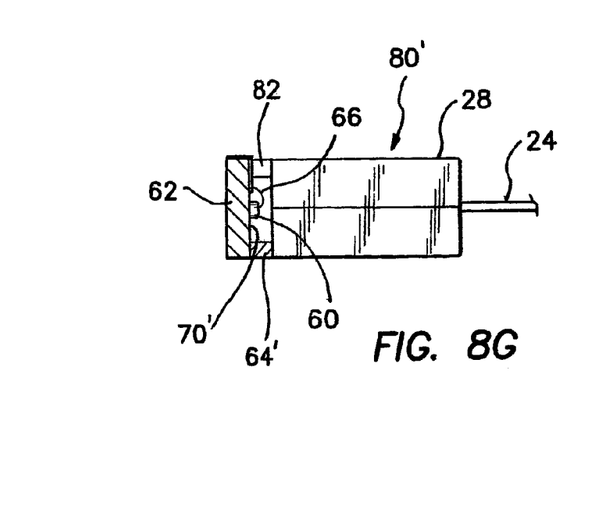
FIG. 8G shows the open spacer of FIG. 8F assembled between the submount and fiber block to make an open protective chamber for the diode array chip without resin encapsulation.

Turning now to FIG. 8F, the open spacer 64' is similar to the closed frame spacer 64 of FIG. 7, but has a break in the frame perimeter defining a resin injection port 82 such that resin may be introduced for encapsulating the diode array chip 60 after the submount 62 and spacer 64' have been optically aligned and assembled to the fiber block 28 to make a protective enclosure containing the chip 60. FIG. 8G shows the open spacer 64' assembled between the submount 62 and fiber block 28 to make an open protective chamber 70' for the diode array chip 60. For non-critical applications the assembly 80' of FIG. 8G may be installed in an optoelectronic module such as module 12 of FIG. 1 without further sealing or encapsulation. The chamber 70' may be non-hermetic or open to some degree, yet provides mechanical protection to the diode chip 60 and wire bonds 66 against mechanical damage during handling, for example. For higher reliability requirements FIG. 8H illustrates the additional step of encapsulating the diode array chip 62 in sealing resin 84 introduced through the resin injection port 82 and also shows how the injection port 82 is itself sealed by a plug 86 of the resin.

Figure 8H:
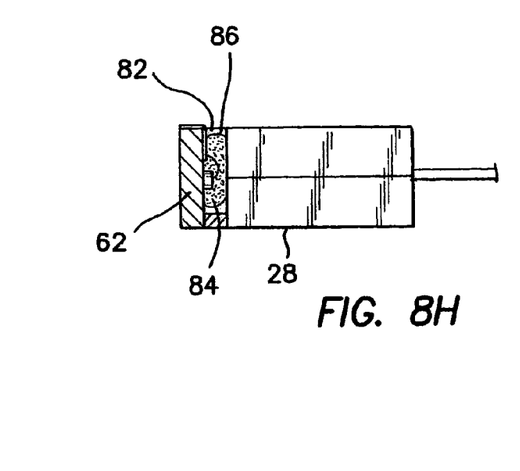
FIG. 8H shows the assembly of FIG. 8G after encapsulation of the diode array chip in sealing resin, and also shows how the injection port of the spacer is sealed by the resin.

The protective cap 30, 30' and 30" of FIGS. 3 through 6E and the spacer 64, 64' of FIGS. 7 through 8H can be made of various materials. By way of example, these elements may be fabricated of glass epoxy, plastic, glass and from suitable metals or metal alloys, among still other possible materials. Appropriate materials will be apparent to those having only ordinary knowledge of this field, and for this reason this invention is not limited to specific materials for these components.

The following commercially available resin and adhesive products have been found suitable for use with this invention:

| | | |
|---|---|---|
| Silicone sealing resin | Shin-Etsu Chemical Co., Ltd. | Product #KJR9017 |
| Epoxy | Epoxy Technology, Inc. | Product #301-2 |

It will be appreciated that in each of the several described embodiments this invention provides a unitary, integrated optical assembly with scalable degrees of protective sealing appropriate to different applications and environments.

While several embodiments of the invention have been described and illustrated for purposes of clarity and example, it should be understood that still other changes, modifications and substitutions to the disclosed embodiments will be apparent to those having only ordinary skill in the art without thereby departing from the scope of the invention, which is defined by the following claims.

What is claimed is:

1. An optoelectronic module comprising:
an optical fiber block;
a plurality of optical fibers having fiber facets terminating on an end face of said optical fiber block;
a submount disposed adjacent to said end face of said optical fiber block;
an edge emitting laser diode array disposed on said submount in optical alignment with said fiber facets of said optical fibers;
a cap disposed on said submount and detachably adjoining said end face of said optical fiber block such that said cap encloses said edge emitting laser diode array and said fiber facets therein, said cap augmenting the contact area between said submount and said fiber block; and
a resin encapsulating said array in said cap, said resin being substantially transparent to light wavelengths passing between said array and said fiber facets, wherein
said cap has an injection hole therein for introducing said resin in an initially fluid uncured state into a chamber formed by said cap, said submount and said end face of said optical fiber block such that the fluid resin is contained by said cap in said uncured state.

2. The module of claim 1 wherein said cap is joined in hermetic sealing relationship to said submount and to said end face.

3. The module of claim 1 wherein said cap comprises a cap bottom bonded to said submount and encompassing said array, and a cap end surface bonded to said end face of said optical fiber block.

4. The module of claim 1 wherein said cap comprises a cap side wall portion bonded to said submount, and a separate cap cover bonded to said cap side wall.

5. The module of claim 1 wherein said resin comprises a silicone resin.

6. The module of claim 1 wherein said resin encapsulates said fiber facets on said end face.

7. The module of claim 1 wherein said resin comprises a relatively compliant inner resin encapsulating said array and a relatively hard outer resin covering said inner resin.

8. An optoelectronic module comprising:
an optical fiber block;
a plurality of optical fibers having fiber facets terminating on an end face of said optical fiber block;
a submount having one of a surface emitting laser diode and a photo diode array disposed thereon;
a spacer interposed between said submount and said end face configured to provide connective coupling between the submount and the end face, such that said spacer encloses said diode array and said fiber facets when the submount is coupled to the end face by way of the spacer; and
a resin encapsulating said diode array in said spacer, said resin being substantially transparent to light transmissions between said diode array and said fiber facets, wherein said spacer is bonded to said submount and to said end face for sealing said diode array and said fiber facets, and said spacer has a resin injection port therein for admitting a sealing resin into a chamber formed by said spacer between said submount and said end face.

9. The module of claim 8 wherein said diode array has a top surface facing said end face and a plurality of diode elements on said top surface, and wire bonds arcing from said top surface to connect said diodes to conductors on said submount, wherein said spacer has a spacer width sufficient to accommodate said diode array and said wire bonds between said submount and said end face.

10. The module of claim 8 wherein said resin injection port is sealed with said sealing resin thereby to seal said chamber.

11. The module of claim 8 wherein said spacer is bonded with an epoxy resin to each of said submount and said end face.

12. The module of claim 8 wherein said spacer is hermetically sealed to said submount and to said end face.

13. A method of sealing an optoelectronic assembly in a transmitter or receiver module comprising:
providing an optical fiber block supporting a plurality of optical fibers each having a fiber facet terminating on an end face of said block to define a fiber facet array;
providing a submount having a top surface and a side surface;
bonding a laser diode array chip having a laser diode array to said top surface of said submount;
providing a cap configured to be disposed on said submount and adjoin to said end face of said optical fiber block such that said cap encloses said laser diode array and said fiber facet array therein, said cap augmenting a contact area between said submount and said fiber block;

affixing said cap to said submount;

optically aligning said diode array with said fiber facet array; and bonding said submount to said optical fiber block, wherein said cap cooperates with said fiber block to define a fluid containment enclosure encompassing said laser diode array chip, and said method further comprising applying liquid resin through a hole in said fluid containment enclosure to encapsulate said laser diode array chip.

14. The method of claim 13 wherein said optically aligning comprises placing said side surface and said end surface in contact with said fiber block during said aligning.

15. The method of claim 13 wherein said cap has three side walls and a top, said end face providing a fourth wall and said submount providing a bottom thereby to define a chamber containing said laser diode array and said fiber facet array.

16. The method of claim 15 wherein said cap has said hole through said top for admitting liquid resin into said chamber.

17. The method of claim 16 wherein said hole is sealed with resin.

18. The method of claim 15 wherein said cap comprises a cap sidewall portion and a separate cap top, and said affixing comprises affixing said cap sidewall portion to said submount to thereby define with said end face said fluid containment enclosure for containing liquid resin over said diode array, and then affixing said cap top to said cap sidewall thereby to define said chamber.

19. A method of sealing an optoelectronic assembly in a transmitter or receiver module comprising:

providing an optical fiber block supporting a plurality of optical fibers each having a fiber facet terminating on an end face of said block to define a fiber facet array;

providing a submount;

bonding a diode array chip having a laser diode array to said submount;

providing a containment dam between said submount and said end face such that said containment dam encloses said diode array and said fiber facets and provides connective coupling between the submount and end face, or augments a contact area between the submount and end face;

affixing said containment dam to said submount for defining a fluid containment enclosure encompassing said diode array chip;

assembling said submount, said containment dam and said optical fiber block with said diode array chip in optical alignment with said fiber facet array; and applying liquid resin to encapsulate said diode array chip, wherein said containment dam cooperates with said optical fiber block to make a closed chamber containing said diode array and said fiber facet array, said closed chamber including a hole or opening for admitting said liquid resin into said closed chamber.

20. The method of claim 19 wherein said assembling comprises bonding said containment dam to said fiber block.

21. The method of claim 19 wherein said assembling comprises bonding said submount and said containment dam to said fiber block.

22. The method of claim 19 wherein said containment dam has one or more end surfaces and said assembling comprises bonding said one or more end surfaces to said fiber block such that the end surfaces of the containment dam augment a contact area between the side surface and the fiber block.

23. The method of claim 19 wherein said submount has a side surface for bonding to said fiber block, said containment dam has one or more end surfaces, and said affixing comprises aligning said one or more end surfaces in coplanar relationship with said side surface such that the containment dam augments a contact area between the side surface and the fiber block.

24. The method of claim 23 wherein said assembling comprises bonding said side surface and said one or more end surfaces to said end face of said fiber block.

25. The method of claim 19 wherein said containment dam comprises a cap having three side walls and a cap top, said end face providing a fourth wall and said submount providing a bottom thereby to define said closed chamber containing said diode array and said fiber facet array, said cap augmenting the contact area between said submount and said fiber block.

26. The method of claim 25 wherein said cap top is unitary with said side walls and further comprising a hole through said cap for admitting said liquid resin into said closed chamber.

27. The method of claim 26 wherein said hole is through said cap top.

28. The method of claim 25 wherein said cap comprises a cap sidewall and a separate cap top, and said affixing a containment dam comprises affixing said cap sidewall to said submount to thereby define said fluid containment dam in cooperation with said end face.

29. The method of claim 28 further comprising affixing a cap top to said cap sidewall thereby to define a closed chamber containing said laser diode array and said fiber facet array.

30. The method of claim 19 wherein said containment dam is at least partly defined by a cap having a plurality of cap side walls and a cap top and said cap cooperates with said optical fiber block to make a closed chamber containing said diode array and said fiber facet array and augments the contact area between the submount and fiber block.

31. The method of claim 19 wherein said containment dam is at least partly defined by a spacer interposed between opposing surfaces of said submount and said fiber block such that the spacer provides connective coupling between the submount and end face.

32. The method of claim 31 wherein said spacer has first and second end surfaces, and wherein said affixing comprises affixing said first of said end surfaces to said submount and said assembling comprises bonding said second of said end surfaces to said fiber block such that the spacer provides connective coupling between the submount and end face.

33. The method of claim 32 wherein said bonding said second of said end surfaces comprises bonding said second of said end surfaces to said end face of said fiber block.

34. The method of any of claims 31 to 33 wherein said spacer has a side opening and said applying liquid resin is performed after said affixing and assembling by introducing liquid resin through said side opening.

35. The method of claim 34 further comprising sealing said side opening of the spacer with resin.

36. An optoelectronic data communication module comprising:

a housing module with electronic transmitter or receiver circuits in said housing module;

an optical fiber block having optical fibers having fiber facets terminating on an end face of said block;

a submount having one of a light emitter diode array and a light detector diode array mounted thereon in optical alignment with said facets and operatively connected to said circuits; and a chamber forming device configured to form a chamber with said submount and said end face of said block such that said chamber forming device encloses said diode array and said facets in said chamber and provides connective coupling between the submount and the end face, or augments a contact area between the submount and end face, wherein:

said chamber forming device also defines a fluid containment dam about said array and the chamber includes a hole or opening therein for admitting a liquid epoxy resin into fluid containment dam, and wherein said array is encapsulated in said epoxy resin contained by said dam.

37. The module of claim 36 wherein said submount is also bonded to said fiber block.

38. The module of claim 36 wherein said submount is bonded to said fiber block and said chamber forming device is also bonded to said fiber block.

39. The module of claim 36 wherein said chamber forming device is intermediate to said submount and said fiber block and provides connective coupling between said fiber block by said chamber forming device.

40. The module of claim 36 wherein said submount has a side surface and said chamber forming device has one or more end surfaces coplanar with said side surface such that both said side surface and said one or more end surfaces can contact said end face whereby alignment of said array to said facets is facilitated and said side surface and said one or more end surfaces are bonded to said fiber block for increased mechanical strength.

41. The module of claim 40 wherein said chamber forming device is bonded in substantially sealing engagement to said submount and said one or more end surfaces is bonded in substantially sealing engagement with said end face such that said array and said facets are enclosed in a sealed chamber.

42. The module of claim 36 to 41 wherein said chamber forming device is selected from the group comprised of a cap and a frame.

43. The module of claim 40 wherein said chamber forming device is a cap and said one or more end surfaces is an end surface shaped as an inverted U relative to said submount.

44. A method of making an optoelectronic assembly in a transmitter or receiver module comprising:

providing an optical fiber block supporting a plurality of optical fibers each having a fiber facet terminating on an end face of said block to define a fiber facet array;

providing a submount;

providing a containment dam configured to be disposed on said submount and adjoin said end face of said optical fiber block such that said containment dam encloses said edge emitting laser diode array and said fiber facets therein, said containment dam having a bottom surface and at least one side surface that augments a contact area between the submount and end face;

bonding a diode array chip to said submount;

bonding said bottom surface of the containment dam to said submount; and bonding one or both of said submount and said one or more side surfaces to said fiber block with said diode array chip in optical alignment with said fiber facet array, wherein said containment dam cooperates with said end face to define a fluid containment enclosure encompassing said diode array chip and the method further comprising applying liquid sealing resin through a hole or opening in said fluid containment enclosure to said diode array chip thereby to encapsulate said chip in said resin.

45. The method of claim 44 wherein said containment dam comprises a cap having three side walls and a cap top and said one or more side surfaces comprise end surfaces of said side walls and said cap top, said end face providing a fourth wall and said submount providing a bottom thereby to define a chamber containing said diode array chip and said fiber facet array, said cap augmenting the contact area between the submount and end face.

46. The method of claim 45 wherein said cap comprises a cap sidewall portion and a separate cap top, and said affixing comprises affixing said cap sidewall portion to said submount to thereby define with said end face said fluid containment enclosure, and then affixing said cap top to said cap sidewall thereby to define said chamber.

47. The method of claim 44 wherein said containment dam comprises a sidewall portion terminating in two said end surfaces.

48. The method of claim 47 wherein said two end surfaces are coplanar with each other.

49. The method of claim 48 wherein said two end surfaces are also coplanar with a bonding surface of said submount such that said end surfaces and said bonding surface are all bonded to said end face of said fiber block.

* * * * *